INVENTOR.

BY MILTON A. CRANDALL

Edwin E. Gregg
ATTORNEY

INVENTOR.

BY MILTON A. CRANDALL

Edwin E. Greigg
ATTORNEY 3,319,187

VOLTAGE CONTROLLED OSCILLATOR UTILIZING TRANSMISSION-LINE SWITCHING ELEMENTS

Milton A. Crandall, Flushing, N.Y., assignor to Simmonds Precision Products, Inc., Tarrytown, N.Y., a corporation of New York Filed Apr. 6, 1966, Ser. No. 547,693
2 Claims. (Cl. 331—117)

This is a continuation-in-part application of Ser. No. 359,196, filed Apr. 13, 1964, now abandoned.

The invention relates to an improved voltage controlled oscillator used to synthesize frequencies in the very high frequency and ultra high frequency range, which provides that a very rapid change of frequency is obtained from one value to another. The very rapid change in frequency of the synthesizer may be accomplished in 10 milliseconds from the time that a command is applied to the synthesizer.

More particularly, the invention relates to the use of an oscillator controlled by logic circuit components in a manner such that the oscillator may synthesize frequencies in a continuous general range in which there is a singleness of equipment, and in which the frequency producing portion of the oscillator may be specifically controlled in a binary nature to produce the frequencies in response to digital commands from the logic circuit. The logic circuit producing the digital commands, whether in binary form or other, is useful in connection with the improved voltage controlled oscillator of the present invention but does not form a component of the present invention.

One form of the invention relates to a two-transistor oscillator strip line resonator that has the strip line resonator that has selected portions thereof selectively shorted out by a binary input applied to diode switching elements connected to the strip line resonator.

It is a further object of the present invention to provide a voltage controlled oscillator having substantial frequency stability of its output amplitude from room temperature values to 85° C.

One embodiment of the the invention is found to provide frequency stability of better than 2% in spite of the fact that no temperature compensation of any nature is used.

A further object of the present invention is to provide a voltage controlled oscillator of the type used in very high and ultra high frequency ranges and which is electrically or electronically tunable over a frequency range of nearly two octaves.

A further object of the present invention is that the oscillator includes a resonator of one-quarter wave length or other odd multiples of the same, and to which along appropriate spacings are applied silicon switching diodes for shorting that portion of the strip line to ground when the diode is forward biased, but the diode switch is considered open when reverse biased and provides its very high forward conductance when forwardly biased. In the reversely biased condition, the diode exhibits its extreme low junction capacitance.

A further object of the present invention is to provide diode switching along a resonant transmission line such as a strip line structure of printed circuit construction in such a manner as to provide equal tuning increments of generally 21 megacycle from one diode switch connection to the next.

The above and other objects and advantages of the present invention will become apparent upon a full consideration of the following detailed description and accompanying drawings in which.

Figures 1, 2:
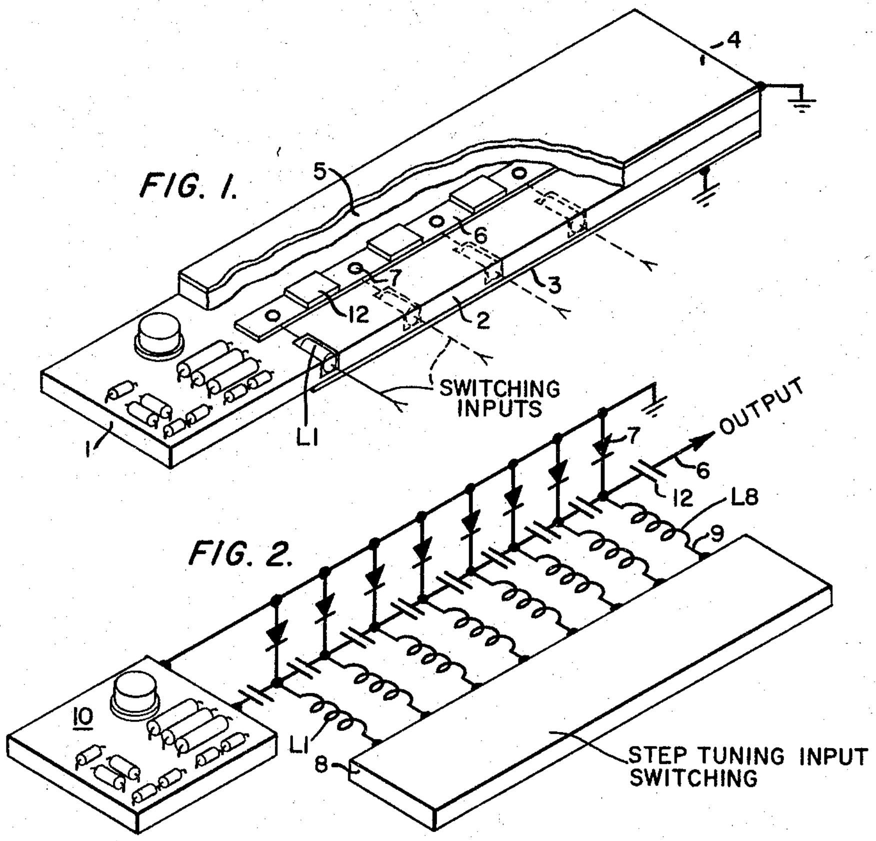
FIG. 1 is a perspective view of the improved voltage controlled oscillator having an electrical tuning switching diode in accordance with a preferred embodiment of the present invention.
FIG. 2 is a schematic circuit diagram of a printed line strip resonator circuit of the voltage controlled electrically tuned oscillator of the present invention.

Referring now to the drawings, there is shown in FIG. 1 a plate 1, comprising a dielectric plate 2, a ground plate 3, a ground plate 4, a dielectric plate 5, a strip line quarter-wave resonator 6 and separating capacitors 12. These are arranged so that the switching diode 7 may be mounted in the openings or apertures of one dielectric plate 2 so that one terminal of the switching diodes 7 engages the ground plate 3, while the other side of the switching diodes 7 engages a mid-portion of strip line quarter-wave length resonator 6. The strip line resonator 6 is sandwiched between dielectric plates. The ground plate may be connected to a ground or a voltage reference potential.

Figure 4:
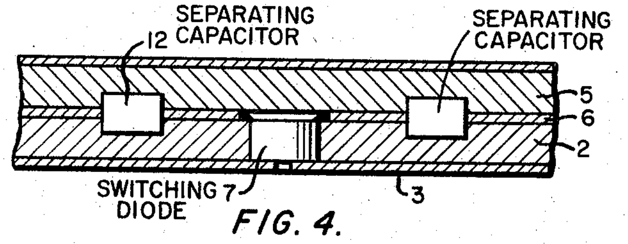
FIG. 4 shows a portion of the printed strip line circuit board in a cross-sectional elevation view.

FIG. 4 shows a cross-section of both dielectric plates 2 and 5, including an aperture for the switching diode 7.

As is shown in FIG. 4, a portion of the strip line 6 extends into electrical contact with only a portion of the switching diodes 7, while the remaining portion of the diodes 7 is in contact with a switch connected conductor 3. Switch connected conductor 3 is shown in FIG. 2 as being connected through a filter network to a step tuning input switching set 8 which selectively applies current to any of the input switching lines 9 so that, as it may be selected from the switching set 8, certain of the diodes are accordingly shorted out by the current so that the resonator 6 is shorted to ground at that point in which it engages electrically with the switching diodes 7.

In this particular embodiment, the resonator 6 is a strip line of one-quarter wave length, and the increments shown between diode connections may be determined by the particular diode selected. Although the switching diode determines the electrical length of the resonator, there is an inductive coupling between the input or oscillator slide of the resonator with the output of the resonator so that when there is an effective electrical short between any points of the resonator 6 and ground plate 4, there is sufficient resonance in the resonator for tuning to provide the desired frequency signal to the output load 11 as determnied by the number and arrangement of switching diodes that are shorted, or not shorted selectively, by the current from the stepped tuning input switching set 8. The tuning is thus accomplished with the switching diodes 7 which may be silicon switching type diodes in a forward biased condition. The diodes may have extremely low junction capacitance when they are reverse biased and a significantly forward conductance when forward biased. The diodes may further include appropriate circuitry as shown simply in FIG. 2 and more intricately in FIG. 5 for selectively biasing the switch diodes. The diodes are spaced along the resonant transmission line resonator 6 in such a manner as to simply provide equal tuning increments of precisely 21 mc. Further, the inductors L1–L8 on the input switching lines 9 are provided to permit D.C. bias current or reverse voltage to be applied to the switching diodes while isolating the D.C. circuit 8 from the RF system.

The portion of the transmission line resonator 6 on the further or downstream side from the particular switching diode which is energized by the switching set 8 with relation to the energization by the frequency oscillation generator 10 is such that the downstream side serves as untuned output transmission line as a result of the printed circuit structure of the resonator 6. The selected switching diode when energized may be considered to serve as a small portion of the one-quarter wave length resonator in which the output load 11 is tapped onto the resonator 6 at an extremely low impedance point.

Figure 3:
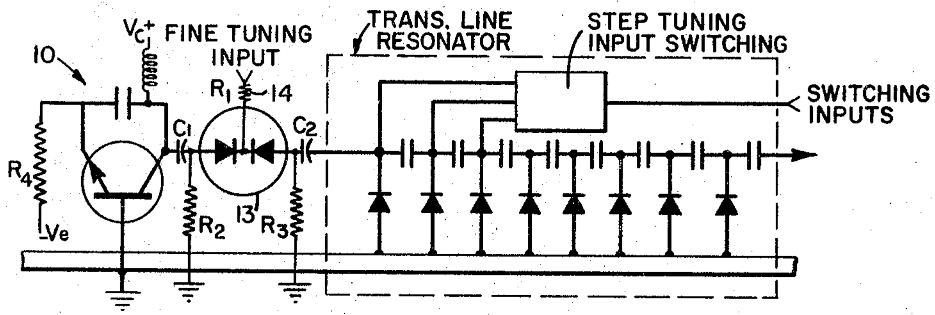
FIG. 3 is a schematic circuit diagram of the switching diode circuits and the oscillator of an embodiment of the invention.
Figure 5:
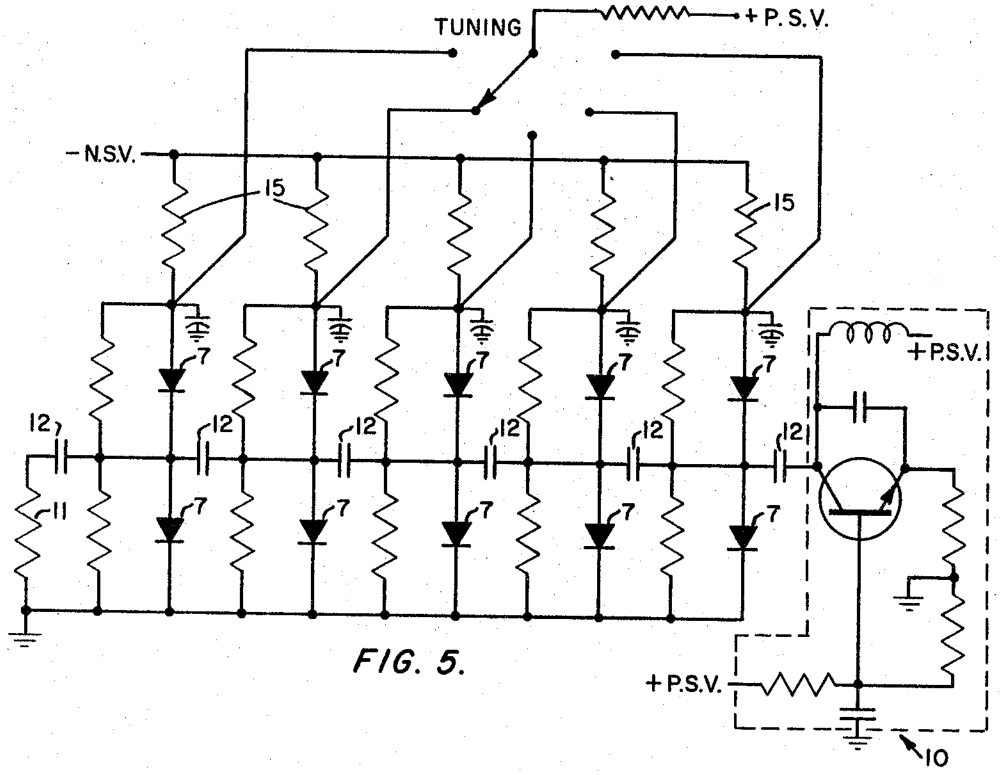
FIG. 5 shows a schematic circuit diagram of the improved voltage controlled oscillator within the scope of embodiments of the present invention.

The frequency stability of the oscillator 10 having the transmission line type resonator 6 is found to be improved as the coupling between the resonator and the transistor of the oscillator 10 is reduced. In the arrangement of FIG. 5, a capacitor element 12 may be used, but in FIG. 3 is shown a small varactor 13 which is connected in series with the oscillator and the input to the resonator. Capacitors $C_1$ and $C_2$ isolate the transistor of the oscillator 10 and the switching voltages from the varactors. $R_1$, $R_2$ and $R_3$ complete the D.C. circuit for the turning voltages. The RFC inductor isolates the collector voltage $V_c$ supplied from the RF system and $-V_e$ and $R_4$ determine the emitter current of the transistor in the oscillator 10. Appropriate inductors may be used if high tuning speed is required. At this point of the transmission line the terminal impedance is highest, and the current value is the lowest. Thus, since the varactor 13 is connected here, the least possible current value is found to flow through the varactor itself. Harmonic generation that may be caused by the non-linear capacitance of the varactor is reduced to the lowest possible value. The varactor, or even a series pair of reversed varactors, further minimizes harmonic generation and serves to provide the effect of a variable tuning element as a fine electronic control of the oscillator frequency.

Since the varactors 13 are generally biased to a value of capacitance near the minimum value, the variation of capacitance with applied voltage from the potential source that may be applied to conductor 14 will be substantially linear, thus affording nearly constant tuning sensitivity.

Two transistor oscillators 10 using strip line resonator 6 and selectively pulsed by the switching set 8 to effect the variously transmission line shorting effects shown in FIG. 5 further provide the incremental tuning and the synthesized frequency effect.

In FIG. 5 the circuit is, in principle, identical to FIGS. 1, 2 and 3 differing only in that the switching of the strip line is accomplished by two diodes at each position instead of one. The diodes 7 then are arranged so that they are in parallel for an RF signal and in series for the D.C. control signal. The resistance in series with the wiper of the tuning switch connected to the power supply voltage determines the forward current through the selected pair of diodes. The series-connected capacitors 12 are identical to those shown in FIG. 1. The capacitors in the resonance structure are of such size as to present negligible reactance at the frequency of oscillation. The grounded capacitors, as shown, provide a low impedance path to ground for RF signals permitting the upper diode to function as a second RF switch effectively in parallel with the lower diode. Resistor 11 is the load to which radio frequency power is to be delivered. Upon selection of a given pair of diodes through the tuning switch, the remaining pairs of diodes are reverse-biased by the negative supply voltage appropriately divided by the resistors 15 as shown. There exists a frequency at which the path to ground from the transistor of the oscillator 10 through a portion of the strip line and through the switching diode or diodes equals one-quarter wave length or some odd multiple thereof. At this frequency the structure will exhibit a high resonant impedance as seen by the transistor of the oscillator 10 and this is the frequency at which oscillations occur.

Since the physical lengths of the diodes are not zero, they exhibit some inductance and in addition, since the bias current through the diodes is not infinite, they also exhibit some resistance. The diodes, therefore, have some finite impedance and this impedance appears in series with the resonant portion of the transmission line. The load resistance 11, in FIG. 5, is made equal to the characteristic impedance $Z_0$ of the transmission line. The portion of the line to the left of the diodes therefore is non-reactive and has no effect on the resonant frequency of the structure. Thus, the output circuit, consisting of the transmission line to the left of the diodes and the load resistance 11, is coupled to the resonant portion of the line because they have the diode impedance in common.

The switching inputs designated in FIG. 3 represent the means by which information enters the bias circuitry 8; this may be a selector switch as shown in FIG. 5 or other means such as multiple parallel binary signals from a computer or other source of digital data.

Figure 6:
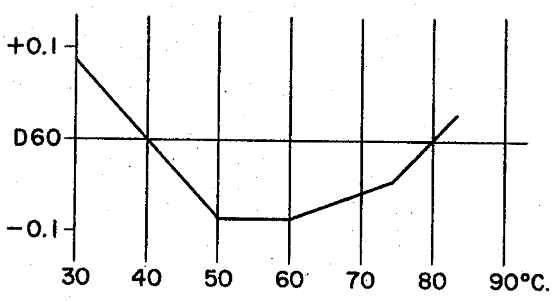
FIG. 6 is an output temperature characteristic curve showing the stability of the oscillator at room temperatures to 85° C.

The modular form of the synthesized frequency oscillator may be conveniently constructed to be generally stable in the output characteristics from room temperature conditions to temperatures of 85° C., as is shown in FIG. 6. From these favorable results, it is apparent that amplitude stability will not be a significant problem in the use of the oscillator. Frequency stability is found to be generally better than 2% over the wide range that the voltage controlled oscillator of the invention is used, and that without temperature compensation of any kind. The drift that was presented is assumed to be due to thermal effects of the transistor collector junction. The temperature coefficient of a reverse biased silicon junction diode, such as that of any silicon transistor, is easily compensated by adjustment of the supply or bias voltages. Temperature compensation can be applied and results in reducing the thermal ferquency drift by at least one order of magnitude which is entirely sufficient to most uses of the oscillator.

If a varactor is used directly as a resonant circuit element in conjunction with the reactive effect of the resonator, large reactive currents currents flow through the varactor to control and generate voltages at frequencies harmonically related to the applied current for the generation of harmonics. The capacitance of the varactor 13 may vary approximately inversely as the square root of the applied bias voltage to result in aresonant frequency circuit ferquency varying substantially as the fourth root of the applied voltage.

The tuning method of the voltage controlled oscillator of the invention selected for synthesizing frequencies over a broad band as provided by the structures of the present invention provides incremental tuning of the transistorized oscillator-resonator combination to minimize the range of continuous tuning usually required. By electrically, or electronically, pre-selecting a band of frequencies by applying selected pulses to portions of a folded strip line quarter-wave length resonator, the tuning range required of the varactor is significantly reduced, while the switching is rapidly accomplished over the range of the oscillator.

Thus the invention provides a voltage controlled oscillator for the synthesizing of frequencies electronically and rapidly tunable to any frequency in the range of say 140 mc. to approximately 280 or 500 mc. with generally good linearity of tuning characteristic.

It should be understood that the specific apparatus herein illustrated and described is intended to be representative only, as changes may be made therein without departing from the clear teachings of the invention. Accordingly, reference should be made to the following claims in determining the full scope of the invention.

What is claimed is:

1. A voltage controlled oscillator for synthesizing oscillations throughout a wide range of high frequencies comprising a strip line printed circuit quarter-wave length resonator, tapped connections extending from intermediate points of said resonator, a switching diode connected to each of said tapped connections, means connecting a forward biasing signal to selected one of said switching diodes to effect an electrical shunt from the tapped connections connected to said selected diode to ground, a grounded base transistor producing oscillations applied to one end of said resonator, an output load of low impedance connected to the other end of said resonator, said output load being coupled to said resonator by an impedance means common to said resonator and said output load, and at least one varactor connected to said grounded base transistor to thereby provide fine tuning capabilities for said resonator.

2. The invention of claim 1 wherein said varactor is connected in series opposition to a further varactor to minimize harmonic generation, said varactors serving as a fine tuning control element by the application of potential thereto.

References Cited by the Examiner

UNITED STATES PATENTS

| | | | |
|---|---|---|---|
| 3,067,394 | 12/1962 | Zimmerman et al. | 331—36 |
| 3,189,823 | 6/1965 | Mitchell | 331—101 |
| 3,213,389 | 10/1965 | Campi et al. | 331—99 |

OTHER REFERENCES

King et al.: Electronics, Electronically-Tuned Wide-Range Oscillator, pp. 184–186, March 1954.

ROY LAKE, *Primary Examiner.*

JOHN KOMINSKI, *Examiner.*